(12) United States Patent
Enquist et al.

(10) Patent No.: US 8,735,219 B2
(45) Date of Patent: May 27, 2014

(54) HETEROGENEOUS ANNEALING METHOD AND DEVICE

(75) Inventors: Paul M. Enquist, Cary, NC (US); Gaius Gillman Fountain, Youngsville, NC (US)

(73) Assignee: Ziptronix, Inc., Morrisville, NC (US)

( * ) Notice: Subject to any disclaimer, the term of this patent is extended or adjusted under 35 U.S.C. 154(b) by 0 days.

(21) Appl. No.: 13/599,023

(22) Filed: Aug. 30, 2012

(65) Prior Publication Data

US 2014/0061949 A1 Mar. 6, 2014

(51) Int. Cl.
*H01L 21/48* (2006.01)

(52) U.S. Cl.
USPC .... 438/107; 257/777; 257/782; 257/E21.122; 257/E21.505; 257/E25.013

(58) Field of Classification Search
USPC .......... 438/107, 109, 406, 455, 459, 618, 974
See application file for complete search history.

(56) References Cited

U.S. PATENT DOCUMENTS

| | | | |
|---|---|---|---|
| 3,175,025 A | 3/1965 | Geen et al. | |
| 7,109,092 B2 * | 9/2006 | Tong | 438/406 |
| 7,192,841 B2 * | 3/2007 | Wei et al. | 438/455 |
| 7,335,572 B2 * | 2/2008 | Tong et al. | 438/406 |
| 2002/0030198 A1 | 3/2002 | Coman et al. | |
| 2002/0048900 A1 | 4/2002 | Lo et al. | |
| 2002/0068396 A1 | 6/2002 | Fitzergald | |
| 2006/0076559 A1 | 4/2006 | Faure et al. | |
| 2006/0121696 A1 | 6/2006 | Shiota et al. | |
| 2006/0199353 A1 | 9/2006 | Kub et al. | |
| 2006/0255341 A1 | 11/2006 | Pinnington et al. | |
| 2009/0042356 A1 * | 2/2009 | Takayama et al. | 438/406 |
| 2009/0068831 A1 * | 3/2009 | Enquist et al. | 438/618 |
| 2009/0191719 A1 * | 7/2009 | Dupont | 438/779 |
| 2011/0128399 A1 | 6/2011 | Fujii | |
| 2012/0003813 A1 | 1/2012 | Chuang et al. | |
| 2012/0028440 A1 | 2/2012 | Castex et al. | |
| 2012/0119224 A1 | 5/2012 | Tai et al. | |
| 2012/0183808 A1 | 7/2012 | Tong | |

OTHER PUBLICATIONS

International Search Report and Written Opinion issued Feb. 7, 2014 in PCT/US2013/057536 filed Aug. 30, 2013.

* cited by examiner

*Primary Examiner* — Julio J Maldonado
*Assistant Examiner* — Rodolfo Fortich
(74) *Attorney, Agent, or Firm* — Oblon, Spivak, McClelland, Maier & Neustadt, L.L.P.

(57) ABSTRACT

A method of integrating a first substrate having a first surface with a first insulating material and a first contact structure with a second substrate having a second surface with a second insulating material and a second contact structure. The first insulating material is directly bonded to the second insulating material. A portion of the first substrate is removed to leave a remaining portion. A third substrate having a coefficient of thermal expansion (CTE) substantially the same as a CTE of the first substrate is bonded to the remaining portion. The bonded substrates are heated to facilitate electrical contact between the first and second contact structures. The third substrate is removed after heating to provided a bonded structure with reliable electrical contacts.

33 Claims, 6 Drawing Sheets

HETEROGENEOUS ANNEALING METHOD AND DEVICE

CROSS-REFERENCE TO RELATED APPLICATIONS

This application is related to U.S. Pat. Nos. 6,902,987; 6,932,835; 7,041,178; 7,335,996; 7,387,944; 7,485,968; 7,602,070; 7,807,548; 7,842,540; 7,871,898; and 8,053,329 and application Ser. Nos. 12/270,585; 12/913,385; 12/954,740 and 13/341,273, the entire contents of which are incorporated herein by reference.

BACKGROUND OF THE INVENTION

1. Field of the Invention

The present invention relates to the field of three-dimensional integrated circuits and more particularly to devices and the fabrication thereof of three-dimensional integrated circuits using direct wafer bonding.

2. Description of the Related Art

Semiconductor integrated circuits (ICs) are typically fabricated into and on the surface of a silicon wafer resulting in an IC area that must increase as the size of the IC increases. Continual improvement in reducing the size of transistors in ICs, commonly referred to as Moore's Law, has allowed a substantial increase in the number of transistors in a given IC area. However, in spite of this increased transistor density, many applications require an increase in total IC area due to a greater increase in required transistor count or an increase in the number of lateral interconnections required between transistors to achieve a specific function. The realization of these applications in a single, large area IC die typically results in a reduction in chip yield and, correspondingly, increased IC cost.

Another trend in IC fabrication has been to increase the number of different types of circuits within a single IC, more commonly referred to as a System-on a-Chip (SoC). This fabrication typically requires an increase in the number of mask levels to make the different types of circuits. This increase in mask levels typically also results in a reduction in yield, and correspondingly, increased IC cost. A solution to avoiding these undesired decreases in yield and increases in cost is to vertically stack and vertically interconnect ICs. These ICs can be of different size, come from different size wafers, comprise different functions (i.e., analog, digital, optical), be made of different materials (i.e., silicon, GaAs, InP, etc.). The ICs can be tested before stacking to allow Known Good Die (KGD) to be combined to improve yield. The economic success of this vertical stacking and vertical interconnect, or three-dimensional 3D SoC, approach depends on the yield and cost of the stacking and interconnection being favorable compared to the yield and cost associated with the increased IC or SoC area. A manufacturable method for realizing this approach is to vertically stack separately fabricated ICs using direct bonding where the direct bonding surface preparation uses conventional wafer fabrication techniques, for example, metal deposition, dielectric deposition, chemo-mechanical polishing, wafer thinning, photolithography masking, and via etching. A further advantage of using direct bonding for 3D SoC fabrication is the ability to achieve a scalable density of vertical interconnections between different layers or tiers of the stack as a result of the direct bond process.

Direct bonding requires a substantially planar surface that does not result from typical IC wafer fabrication. Achieving an adequate wafer planarization can thus be a substantial element of cost in a direct bond process. It is thus desirable to have a device that comprises a structure and a method to fabricate said structure requiring a minimum cost to achieve this required surface planarity.

Metal direct bonding includes methods and devices for forming 3D structures wherein electrically isolated electrical interconnections can be made across a bond interface which can be formed by aligning and placing two surfaces of two elements into direct contact. Each surface can have insulating and conducting portions and aligned conducting portions can result in a 3D electrical interconnection across the bond interface, and aligned insulating portions can isolate 3D electrical interconnections from other 3D electrical interconnections.

The details of making of a 3D electrical interconnections across the bond interface depends on the relative planarity of the insulating and conducting portions. For example, if the conducting portions are higher than the insulating portions, a 3D interconnection can be made by simply placing two surfaces into contact, for example if the there is not a native oxide on the conducting portion preventing a 3D interconnection and the extension of the conducting portion above the insulating portion is sufficiently small that insulating portions can also bond in direct contact with surface compliance. 3D interconnections may also not be made by simply placing two surfaces into contact, for example if the conducting portions are lower than the insulating portions such that the conducting portions do not come into contact when the surfaces are place together. In this example, 3D interconnections can be made with a slight increase in temperature due to the coefficient of thermal expansion (CTE) difference between the conducting and insulating portion and an adequate bond energy between insulating components that sufficiently compresses the conducting components during heating if the elements are of standard thickness. If the CTE of the elements are comparable, the slight increase in temperature to make a connection can be accommodated by the bond energy of the insulating portions that are in contact and the stiffness of the element. If the CTE of the elements are not comparable, for example for some heterogeneous material combinations, high bond energy of the insulating portions in contact can result in fracture of one or both of the elements during the heating used to make the 3D interconnections. This fracture can be avoided by thinning one of the elements sufficiently prior to heating. This thinning increases the compliance of the element by reducing its stiffness so that it can accommodate the CTE difference of the elements. Thinning to accommodate this difference in CTE can result in a reduced stiffness of the element such that compression is not adequate to make a 3D interconnection.

SUMMARY OF THE INVENTION

The present invention is directed to a compression device and method that will facilitate formation of direct bonded 3D interconnections between two elements when heated where one or both elements are thinned sufficiently to compromise the stiffness of the thinned element or elements that is required to make a 3D interconnection across a bond interface between the two elements.

In one example of the method and device, two heterogeneous wafers containing semiconductor material with different CTE have surfaces suitably prepared for metal direct bonding wherein the conductive metal portion or portions of the surface are below the insulating portion or portions. The wafers are aligned and placed into contact and the insulating portions form a direct bond with high bond energy. A first wafer is then thinned, but the thinning reduces the stiffness of the thinned wafer below that required to reliably form 3D interconnections. A third wafer with a CTE comparable to the second wafer is then direct bonded to the thinned side of the first wafer, increasing the stiffness of the thinned wafer, and the bonded structure is heated, allowing 3D interconnections to form.

In a second example of the method and device, two heterogeneous wafers containing semiconductor material with different CTE have surfaces suitably prepared for metal direct bonding wherein the conductive metal portion or portions of the surface are below the insulating portion or portions. The wafers are aligned and placed into contact and the insulating portions form a direct bond with high bond energy. A first wafer is then thinned, but the thinning reduces the stiffness of the thinned wafer below that required to reliably form 3D interconnections. A third wafer with a CTE comparable to the second wafer is then clamped to the thinned side of the first wafer, increasing the stiffness of the thinned wafer, and the bonded structure is heated, allowing 3D interconnections with heating.

BRIEF DESCRIPTION OF THE DRAWINGS

A more complete appreciation of the present invention and many attendant advantages thereof will be readily obtained as the same becomes better understood by reference to the following detailed description when considered in connection with the accompanying drawings, wherein.

DETAILED DESCRIPTION OF THE PREFERRED EMBODIMENTS

Figure 1:
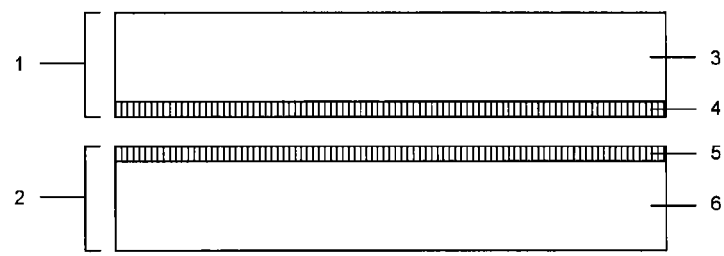
FIG. 1 is a diagram of two wafers with a major portion and a direct metal bond portion.

Referring now to the drawings, in particular FIG. 1, a first embodiment of the method according to the invention will be described. It is noted here that the drawings are not drawn to scale but are drawn to illustrate the concepts of the invention.

Figure 10A:
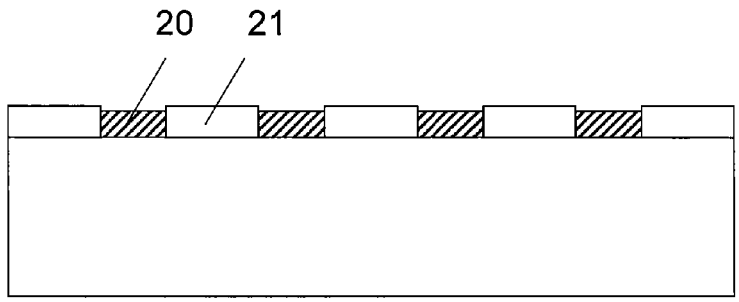
FIGS. 10A-10C are detailed views of the metal bonding region.
Figure 10B:
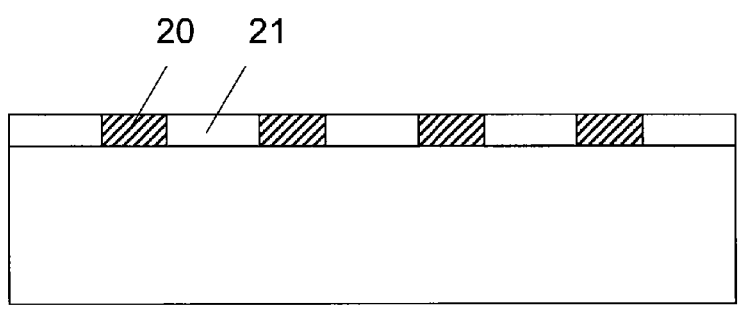
Figure 10C:
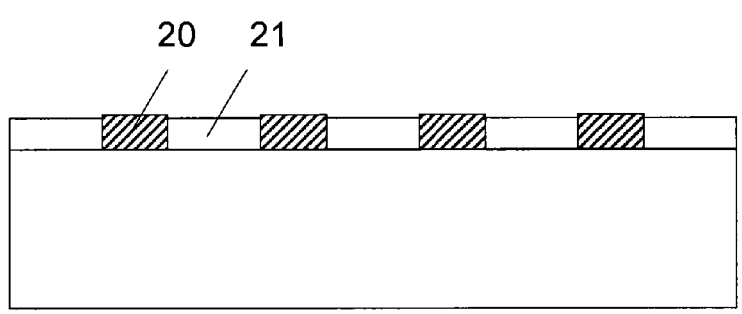

Two wafers, 1 and 2 are prepared for bonding. The wafers are of different material, and have different CTE. Wafer 2 includes a major portion 6 and a direct metal bond portion 5. Direct metal bond portion 5 has a surface with insulating and metal portions. The insulating portions are preferably an oxide or nitride, and more preferably a silicon oxide or silicon nitride. The portion 5 is shown in more detail in FIGS. 10A-10C. Metal pads 20 may be below, flush or above the oxide or nitride material 21 depending upon the process conditions and desired configuration. In the case where chemo-mechanical polishing is used on the surface, the metal pads can be dished and have a surface below the surface of the oxide or nitride material or the oxide or nitride material can be dished and have a surface below the surface of the metal pads.

Major portion 6 can include substrate, device, and interconnect portions that are, for example, found in industry standard manufactured semiconductor wafers, such as CMOS wafers that typically are manufactured with a copper or aluminum back-end-of-line process. Wafer 1 includes a major portion 3 and a direct metal bond portion 4. Major portion 3 can include substrate, device, and contact portions that are, for example, found in industry standard gallium nitride-based hetero-epitaxial device structures grown on sapphire (GaN/sapphire) that have contacts formed to the hetero-epitaxial material.

Figure 2:
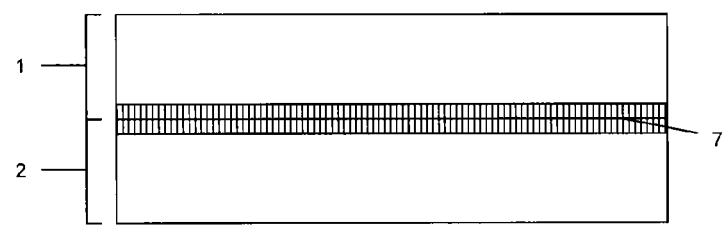
FIG. 2 is a diagram of two wafers with a major portion and a direct metal bond portion aligned and placed together forming a bond interface.

Wafer 1 and wafer 2 are direct metal bonded as described in application Ser. Nos. 09/505,283, 10/359,608 and 11/201,321, as shown in FIG. 2. If the surfaces of metal portions are below the surfaces of insulating portions, only the insulating portions may be in direct contact at interface 7 after the wafers are first placed into contact. The bonded wafers may then be heated to increase the bond energy between the bonded insulating portions, but not at too high a temperature for CTE induced strain to break the bond between the insulating portions or break the bonded wafers. The optimum temperature to increase bond energy will depend on the CTE difference and thickness of the wafers bonded. For example, when bonding a GaN/sapphire structure of approximate range 500-1000 micron sapphire thickness to silicon CMOS of approximate range 500-750 micron thickness, a temperature in the range of 75-150° C. may be preferable to achieve a bond energy of greater than 1 J/m$^2$ and preferably greater than 2 J/m$^2$. Higher temperatures are possible if a thinner material is used or materials with a lower CTE difference are used to facilitate achieving even higher bond energies greater 2.5 J/m$^2$. Although this temperature range can be sufficient to achieve a very high bond energy, it may not be sufficient to form 3D interconnections depending on the relative height of the metal and insulating portions and the type of metal used. For example, if copper is used, a temperature range of 150-250° C. may be required if the copper is 0-10 nm below a silicon oxide insulating portion. Alternatively, if nickel is used, a 250-350° C. temperature range may be required to make 3D interconnections if the nickel is 0-10 nm below a silicon oxide insulating portion. The lower temperature range requirement of the copper compared to the nickel is an example of where the type of metal can affect the temperature range wherein the higher expansion coefficient of copper (~17 ppm/° C.) compared to that of nickel (~13 ppm/° C.) results in more expansion at a given temperature resulting in a lower temperature range for a given difference in height between the metal and insulating portions of the bond surface Higher temperatures may thus be required to facilitate electrical interconnections while higher temperatures may not be possible with this configuration of bonded wafers due to CTE induced strain that would break the bond between the insulating portions or break the bonded wafers.

Figure 3:
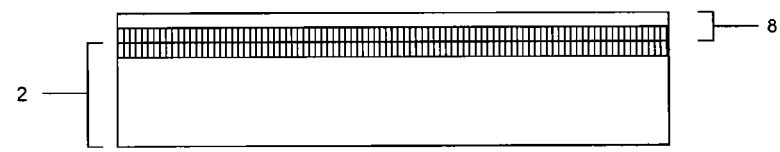
FIG. 3 is a diagram of two wafers with a major portion and a direct metal bond portion aligned and placed together forming a bond interface with a substantial portion of the major portion of one of the two wafers removed resulting in a thinned portion of a direct metal bonded pair.

Major portion 3 is then thinned as shown in FIG. 3 to form thinned layer 8 having a thickness typically in the range of 1-10 microns. The thickness of layer 8 may be outside this range depending upon the application and materials. For example, bonded material combinations with a low CTE mismatch of <2 ppm/° C. may allow a thicker layer 8 in the range of 10-100 microns and applications requiring the transfer of layers less than one micron may use a thinner layer 8 of 0.10-1.0 microns. Thinning may include one or a combination of backgrinding, polishing, etching, or laser liftoff. For example, if wafer 2 is a GaN/sapphire structure, laser liftoff can be used to remove the sapphire resulting in a very thin GaN device layer with metal contact portions. The thinned layer 8 allows heating to a higher temperature without breaking the bond between the insulating portions or breaking the bonded wafers due to increased compliance or elasticity. The allowed increased temperature depends on the materials and the reduced thickness of layer 8. For example, temperatures in excess of 350° C., for example 350° C. to 400° C., can be enabled by this thinning for bonded material that have a high CTE mismatch of 2-5 ppm/° C. and a layer 8 thickness of 2-20 microns. This increased temperature range enabled by reduced layer 8 thickness may be suitable to enable 3D interconnections or for other processing, for example oxide deposition or annealing. It is not necessary to use the full extent of this increased temperature range for other processing. For example, other processing below the maximum increased temperature range that is higher than that allowed prior to increasing the temperature range is possible.

In some cases, layer 8 may be too thin to provide adequate stiffness to produce adequate compression between metal portions at the surface of wafers 1 and 2 to form reliable 3D interconnections if wafers are heated to facilitate electrical interconnections. For example, if layer 8 is in the range of 1 to 10 microns thick, with an upper portion of this layer, for example 0.2 to 2.0 microns, comprising a heterogeneous combination of insulative and conductive bonding material, considerable stress normal to the bond interface in the vicinity of the interface between the insulating and conductive bonding material can be generated at low temperatures, for example less than 300° C., due to the CTE difference between insulative and conductive bonding material. This normal stress can distort the thin layer, resulting in less compressive force between metal portions and preventing electrical interconnections across the bond interface. This distortion results from a CTE mismatch induced extrusion of the conductive bonding material relative to the insulating bonding material at the thinned surface that is not constrained by the thinned layer due to the reduced stiffness of the thinned layer compared to that without partial or total removal of the substrate.

Figure 4:
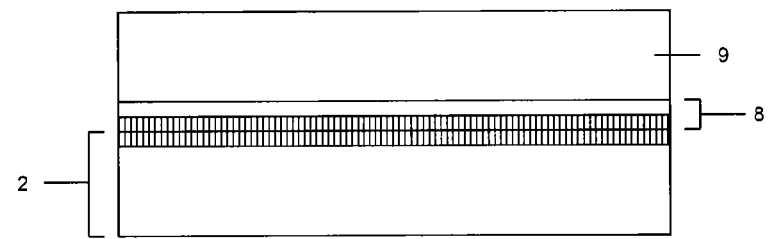
FIG. 4 is a diagram of a stiffening wafer attached to the thinned portion of a direct metal bonded pair.

This reduced stiffness can be compensated by bonding a third wafer 9 to thinned major portion 8 to reduce or prevent the distortion of layer 8 and enable adequate compression between metal portions at the surface of wafers 1 and 2 to form 3D interconnections with heating after the bonding of third wafer 9 as shown in FIG. 4. The minimum thickness of third wafer 9 required can be determined experimentally, however, this thickness will typically be less than a standard wafer thickness, for example 50-100 microns for 100-300 mm diameter wafers with standard thickness of about 0.5-0.8 mm as the stiffness is increased substantially with relatively small thickness being dependent on the cube of the thickness of third wafer 9. A reduced thickness of third wafer 9 may be obtained by thinning third wafer 9 before or after attaching. A wafer 9 thickness larger than the minimum thickness, for example a standard wafer thickness, may also be used.

Figure 11:
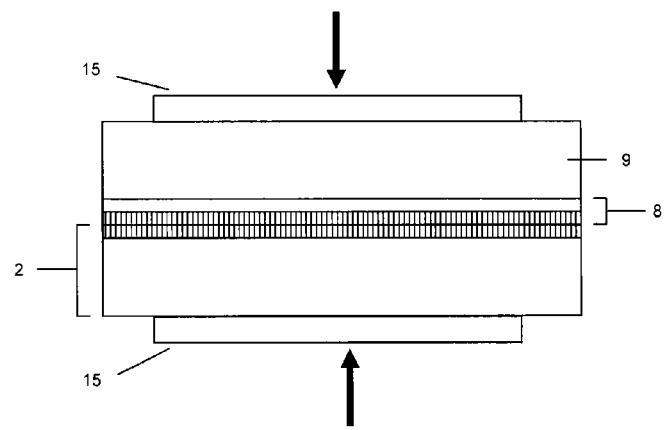
FIG. 11 is a diagram of a wafer bonded with a clamp.
Figure 12:
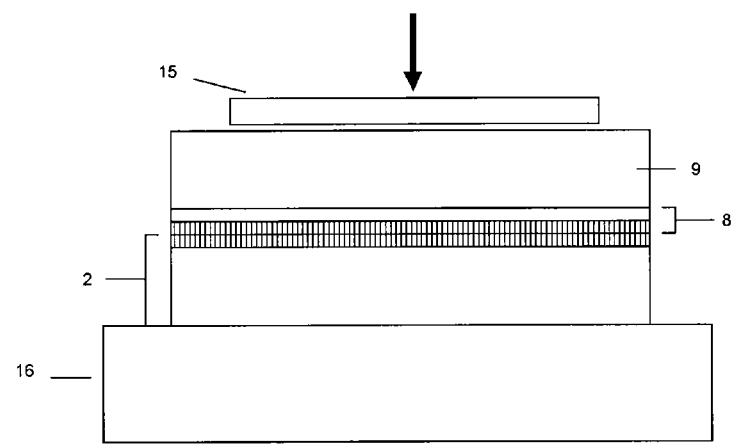
FIG. 12 is another diagram of a wafer bonded with a clamp.
Figure 13:
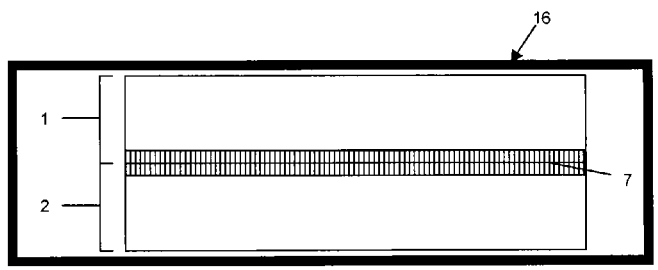
FIG. 13 is a diagram of bonding using a flexible container.

The attachment of third wafer 9 can be with a variety of methods, for example with a direct bond, as described in application Ser. No. 09/505,283, or a clamp 15 as shown in FIG. 11. If with a direct bond, the attachment may include the addition of bonding layers on wafer 9 and/or thinned portion 8. If with a clamp, clamp 15 is shown in FIG. 11 with the external pressure applied to both sides of wafer stack represented by the arrows. This can be done by applying external pressure from both sides as shown in FIG. 11 or by applying external pressure from one side with opposing side restrained by a chuck 16 as shown in FIG. 12. Third wafer 9 preferably has a CTE comparable to wafer 2 to prevent excessive stress during subsequent heating to form 3D interconnections. For example, if wafer 1 is GaN/sapphire, and wafer 2 is silicon CMOS, third wafer 9 can be silicon. The workable range of the difference in CTE depends on the materials, their area and their thicknesses. For example, when bonding 200 mm diameter silicon wafers and using silicon oxide and copper as insulating and conductive bond materials, respectively, it is preferable to have a difference in CTE less than 0.5 ppm/° C. When working with larger wafers, for example 300 mm wafers, it is preferable to have a smaller difference in CTE less than 0.3 ppm/° C. and when working with smaller wafers, for example 200 mm wafers, it is possible to have a larger difference in CTE less than 1.0 ppm/° C. When working with bond materials with a smaller difference in CTE, for example silicon oxide and nickel, it is preferable to have wafers with a smaller difference in CTE to allow for relatively more heating.

Figure 14:
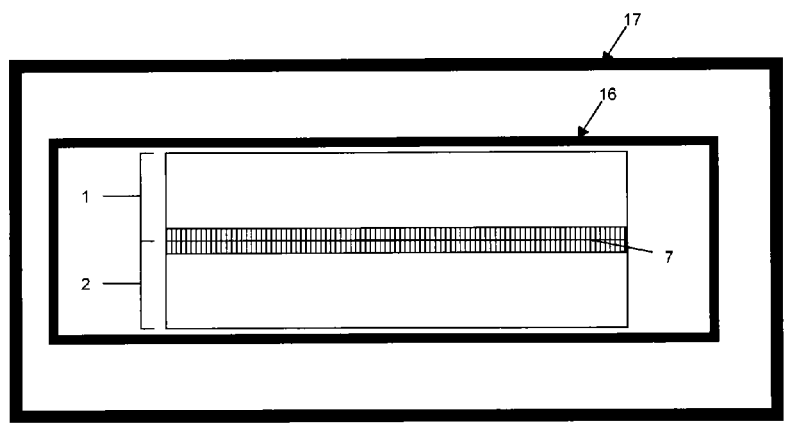
FIG. 14 is a diagram of applying pressure to the flexible container of FIG. 13.
Figure 15:
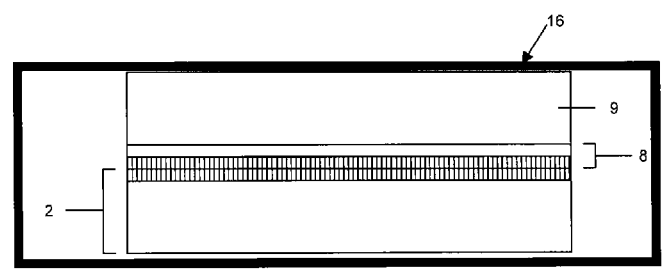
FIG. 15 is a diagram of bonding using a flexible container.
Figure 16:
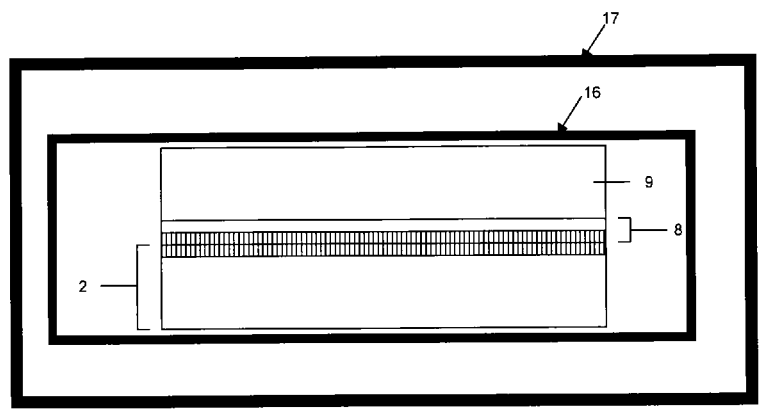
FIG. 16 is a diagram of applying pressure to the flexible container of FIG. 15.

A flexible clamping arrangement as shown in FIGS. 13-16, can be used to assist in holding the bonded wafers together during heating while in addition accommodating bowing of the wafers which will naturally occur during heating due to the CTE difference of the wafers. This method can be applied to the first bond of two wafers of FIG. 2 with different CTEs (shown with flexible clamp methods in FIGS. 13 and 14), and also to the 3 layer stack of FIG. 4 with two thick CTE matched materials bonded to the thinner layer of different CTE material sandwiched between the two thicker layers (shown with flexible clamp methods in FIGS. 15 and 16). The flexible clamping arrangement consists of 2 layers of flexible material, for example a silicone rubber sheet, enclosing the bonded materials, and sealed at the edges forming a sealed envelope 16. The material used must be able to withstand the temperature that is to be applied to the bonded layers. Pressure is applied either by evacuating the space within the flexible material envelope, thus applying atmospheric pressure evenly around the outside of the structure (FIGS. 13, 15), and/or by putting the flexible envelope and its contents into a high pressure chamber 17, and applying the desired pressure evenly around the envelope and its contents to compress the layers together (FIGS. 14, 16). In both cases, heat is then applied to the envelope and its contents to strengthen the bond(s) while bowing of the bonded stack is allowed to accommodate CTE mismatch and prevent breaking of the layers.

The bonded stack of wafers 1, 2, and 3 shown in FIG. 4 can then be heated to higher temperatures than previously to form 3D interconnections if interconnections have not already been made due to a lack of temperature. For example, 300-350° C. may be required if wafer 1 is GaN/sapphire, wafer 2 is silicon CMOS, wafer 3 is silicon, and the metal is nickel. This ability to heat to a higher temperature has been enabled by replacing a major portion of wafer 2 that is CTE mismatched to wafer 1 with wafer 9 that is CTE matched to wafer 1. These higher temperatures are now possible to facilitate electrical interconnections with higher temperatures due to this reduction in CTE mis-match. These higher temperatures were previously not possible due to CTE induced strain that would break the bond between the insulating portions or break the bonded wafers.

Figure 5:
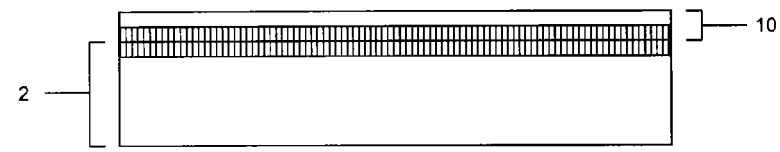
FIG. 5 is a diagram of a thinned portion of a direct metal bonded pair after removal of a stiffening wafer.

After heating, wafer 3 can be removed as shown in FIG. 5, to leave portion 10. Portion 10 may be essentially thinned portion 8 or may be thicker, for example if a bonding layer portion of wafer 9 is not removed or may be thinner, for example if a bonding layer portion of thinned portion 8 is removed. Removal can be with a variety of methods, for example, one or a combination of backgrinding, chemo-mechanical polishing, or etching. Such techniques may be used when wafer 3 is silicon. Wafer 3 may also not be removed, for example if wafer 3 has a useful function, for example as part of a packaging function.

Figure 6:
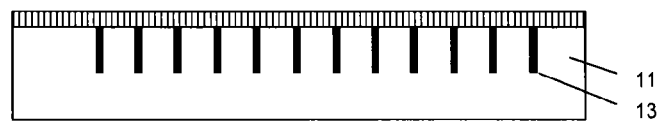
FIG. 6 is a diagram of a second embodiment including filled vias.
Figure 7:
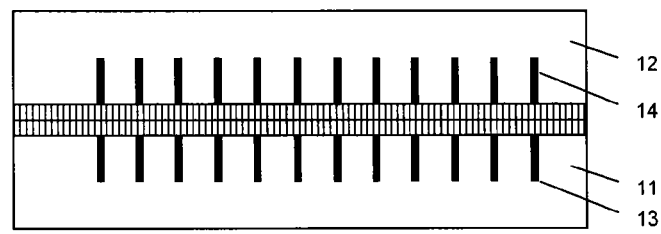
FIG. 7 is a diagram of two wafers bonded each having filled vias.

A second embodiment of the method according to the invention will now be described. Either one or both of wafer 11 and wafer 12 may contain a via or vias 13 filled with metal that extend through all, most, or a portion of either one or both of wafer 11 and wafer 12, respectively as shown in FIGS. 6 and 7 for filled vias 13 and 14 that extend through about half of wafer 11 and wafer 12, respectively, and at a larger pitch than the conductive material at the bond interface. The vias may be electrically connected to the conductive material at the bond interface. If both wafer 11 and wafer 12 have filled vias, the filled vias may be opposed during the alignment and placement of wafer 1 and wafer 2 together as shown for filled vias 13 and 14, respectively. Vias 13 and 14 may also be not opposed.

Figure 8:
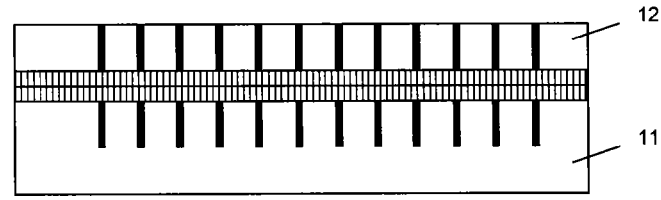
FIG. 8 is a diagram of showing the structure of FIG. 7 with the vias exposed.
Figure 9:
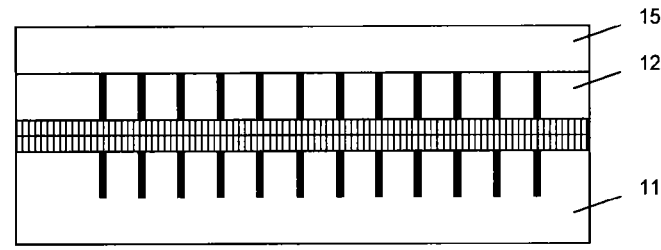
FIG. 9 shows the attachment of an additional substrate to the structure of FIG. 8.

After wafer 12 is thinned, vias may be exposed as shown in FIG. 8 or may have a very thin residual portion of wafer 1 preventing exposure. For example, the residual wafer 12 thickness may be less than 100 microns. Heating of the structure in FIG. 8 or a similar structure with a residual portion on filled vias will result in additional vertical and horizontal stress than described previously for the metal bonding due to the expansion coefficient difference between the filled vias surrounding material. The lack of a wafer 3 to inhibit relaxation of this stress can distort the direct metal bond interface and prevent proper bonding. The attachment or bonding of a wafer 15 as shown in FIG. 9 can inhibit relaxation of this stress and mitigate distortion of the metal bond interface and promote 3D electrical interconnections across the metal bond interface. As in embodiment 1, this wafer 15 is preferably made from material with a CTE match to that of wafer 11.

Numerous modifications and variations of the present invention are possible in light of the above teachings. It is therefore to be understood that within the scope of the appended claims, the invention may be practiced otherwise than as specifically described herein.

The invention claimed is:

1. A method of integrating a first element having a first contact structure with a second element having a second contact structure, comprising:
  bonding a first element with a first metal bonding structure directly to a second element with a second metal bonding structure;
  thinning said first element to a thickness that would result in distortion of said first element if heated to a temperature to facilitate direct connections between the first and second direct metal bonding structure; and
  attaching a third element having a thickness to reduce said distortion to the thinned first element;
  heating bonded first, second, and third elements; and
  forming electrical connections between said first and second metal bonding structures.

2. The method recited in claim 1, further comprising removing the third element.

3. The method recited in claim 1, wherein the bonding comprises applying pressure using a clamp.

4. The method recited in claim 3, comprising placing the first and second elements in a flexible container.

5. The method recited in claim 4, comprising evacuating the flexible container.

6. The method recited in claim 4, comprising applying pressure to the container.

7. A method of integrating a first element having a first surface with a first insulating material and a first contact structure with a second element having a second surface with a second insulating material and a second contact structure, comprising:
  directly bonding the first insulating material to the second insulating material;
  removing a portion of the second element to leave a remaining portion having a first thickness;
  directly bonding a third element having a coefficient of thermal expansion (CTE) substantially the same as a CTE of the first element to the said remaining portion; and
  heating the first and third elements and remaining portion to directly contact the first and second contact structures.

8. The method recited in claim 7, further comprising removing the third element.

9. The method recited in claim 7, wherein the first and second contact structures comprise nickel, the first element comprises a GaN/sapphire substrate, the second element comprises a silicon CMOS substrate, and the third element comprises a silicon substrate, the method comprising:
  heating to a temperature in a range of 300-350° C.

10. The method recited in claim 7, wherein the first element comprises a GaN/sapphire structure with sapphire substrate in the range of approximately 500-1000 micron thickness, the second element comprises a silicon CMOS substrate of 500-750 micron thickness, the method comprising:
  heating to a temperature in a range of 75-150° C.

11. The method recited in claim 7, wherein the first and second contact structures comprise copper, the first element comprises silicon oxide, the second element comprises silicon oxide, the method comprising:
  heating to a temperature about 100° C.

12. The method recited in claim 7, wherein the first element and the second element have a difference in coefficient of thermal expansion of less than 0.5 ppm/° C.

13. The method recited in claim 7, wherein the first and third elements have substantially the same coefficient of thermal expansion.

14. The method recited in claim 13, wherein the second element has a coefficient of thermal expansion different from the first and third elements.

15. The method recited in claim 7, wherein the first thickness is in a range of 1-10 microns.

16. The method recited in claim 7, comprising:
  directly bonding the third element having a coefficient of thermal expansion different from the CTE of the first element in a range of 0.3 to 1.0 ppm/° C.

17. The method recited in claim 7, comprising:
  directly bonding the third element having a coefficient of thermal expansion different from the CTE of the first element by less than about 0.3 ppm/° C.

18. The method recited in claim 7, comprising:
    directly bonding the third element having a coefficient of thermal expansion different from the CTE of the first element by less than about 0.5 ppm/° C.
19. The method recited in claim 7, comprising:
    directly bonding the third element having a coefficient of thermal expansion different from the CTE of the first element by less than about 1.0 ppm/° C.
20. The method recited in claim 7, wherein at least one of the first and second contact structures is copper, comprising:
    heating to a temperature in a range of 150-250° C.
21. The method recited in claim 20, comprising:
    forming at least one of the first and second contact structures to have a surface 0-10 nm below a surface of the respective first and second insulating material.
22. The method recited in claim 7, wherein at least one of the first and second contact structures is nickel, comprising:
    heating to a temperature in a range of 250-350° C.
23. The method recited in claim 22, comprising:
    forming at least one of the first and second contact structures from to have a surface 0-10 nm below a surface of the respective first and second insulating material.
24. The method recited in claim 7, comprising:
    thinning the third material to a thickness in a range of about 0.1-1 nm.
25. The method recited in claim 7, comprising:
    thinning the third material to a thickness in a range of about 1-10 nm.
26. The method recited in claim 7, comprising:
    thinning the third material to a thickness in a range of about 10-100 nm.
27. The method recited in claim 7, comprising:
    thinning the third material to a thickness in a range of about 2-20 nm; and
    heating to a temperature of at least 350° C.
28. The method recited in claim 7, comprising:
    forming a via filled with conductive material connected to at least one of the first and second contact structures.
29. The method recited in claim 7, wherein at least one of said first and second contact structures comprises a direct metal bonding structure.
30. The method recited in claim 7, wherein the bonding comprises applying pressure using a clamp.
31. The method recited in claim 30, comprising placing the first and second elements in a flexible container.
32. The method recited in claim 31, comprising evacuating the flexible container.
33. The method recited in claim 31, comprising applying pressure to the container.

* * * * *